United States Patent [19]

Carter et al.

[11] Patent Number: 5,895,259
[45] Date of Patent: Apr. 20, 1999

[54] POLYSILICON DIFFUSION DOPING METHOD EMPLOYING A DEPOSITED DOPED OXIDE LAYER WITH A HIGHLY UNIFORM THICKNESS

[75] Inventors: W. Mark Carter; Allen L. Evans; John G. Zvonar, all of Austin, Tex.

[73] Assignee: Advanced Micro Devices, Inc.

[21] Appl. No.: 08/647,637

[22] Filed: May 15, 1996

[51] Int. Cl.$^6$ .................................................. H01L 21/44
[52] U.S. Cl. .................. 438/563; 438/563; 438/660; 438/783; 438/784; 438/788; 438/789; 438/790; 438/795; 438/914; 438/915; 148/DIG. 51
[58] Field of Search ........................ 438/568, 660, 438/783, 784, 787, 788, 789, 795, 790, 914, 915, FOR 242, FOR 324, FOR 334, 395; 148/DIG. 51

[56] References Cited

U.S. PATENT DOCUMENTS

| | | | |
|---|---|---|---|
| 4,504,332 | 3/1985 | Shinada | 148/187 |
| 4,698,104 | 10/1987 | Barker et al. | 437/141 |
| 4,839,306 | 6/1989 | Wakamatsu | 437/67 |
| 5,005,067 | 4/1991 | Sakata et al. | 357/54 |
| 5,236,870 | 8/1993 | Sakata et al. | 437/195 |
| 5,323,032 | 6/1994 | Sato et al. | 257/198 |
| 5,482,876 | 1/1996 | Hsieh et al. | 437/40 |
| 5,736,434 | 4/1998 | Konuma et al. | 438/151 |

OTHER PUBLICATIONS

Wolf et al., "Silicon Processing for the VLSI Era", vol. 2, pp. 176–182.

*Primary Examiner*—Peter Toby Brown
*Assistant Examiner*—Long Pham
*Attorney, Agent, or Firm*—Kevin L. Daffer; Conley, Rose & Tayon

[57] ABSTRACT

A polysilicon diffusion doping method which employs a deposited dopant-rich oxide layer with a highly uniform distribution of dopant atoms and thickness. Polysilicon layers 1,500 angstroms thick have been doped, achieving average resistance values of 60 ohms and non-uniformity values of 5 percent. Resistance values were measured using the four-point probe method with probe spacings of 0.10 cm. After a polysilicon layer has been formed upon a surface of a silicon wafer, a dopant-rich oxide layer is deposited upon the polysilicon layer at reduced pressure. The dopant-rich oxide layer is deposited, and serves as a source of dopant atoms during the subsequent diffusion process. The dopant-rich oxide layer is a phosphosilicate glass (PSG) including phosphorus pentoxide ($P_2O_5$) and phosphorus trioxide ($P_2O_3$) and deposited using a PECVD technique. Following deposition of the dopant-rich oxide layer, the silicon wafer is heated to drive dopant atoms from the dopant-rich oxide layer into the underlying polysilicon layer, and to electrically activate the dopant atoms within the polysilicon layer. The presence of electrically active dopant atoms within the polysilicon layer lowers the electrical resistivity of the polysilicon layer. After the heating step, the dopant-rich oxide layer is removed.

22 Claims, 5 Drawing Sheets

POLYSILICON DIFFUSION DOPING METHOD EMPLOYING A DEPOSITED DOPED OXIDE LAYER WITH A HIGHLY UNIFORM THICKNESS

BACKGROUND OF THE INVENTION

1. Field of the Invention

This invention relates to the manufacture of integrated circuits and more particularly to the doping of a layer of polycrystalline silicon.

2. Description of the Relevant Art

Polycrystalline silicon (also called polysilicon, poly-Si, or poly) deposited in thin film form has many important applications in the manufacture of integrated circuits. When doped with impurities, polysilicon exhibits low resistivity. Heavily doped polysilicon films are widely used as gate electrodes and interconnect lines in modern metal oxide semiconductor (MOS) transistors. Polysilicon is used in these applications for a number of reasons. Two important reasons are that polysilicon adheres well to silicon dioxide (oxide) insulating layers, and that polysilicon is able to withstand high temperatures involved in subsequent processing steps (e.g., source-drain implant anneal and thermal oxidation).

Dopant atoms may be introduced into a polysilicon layer during the formation of the polysilicon layer, by diffusion following formation, or by ion implantation. Polysilicon layers are typically not doped during formation due to the inability to closely control the thicknesses and doping uniformities of the layers. Diffusion doping involves the introduction of dopant atoms into an exposed surface of a polysilicon layer from a dopant-bearing ambient at elevated temperatures. During an ion implantation procedure, dopant atoms are ionized, accelerated to a velocity high enough to penetrate the surface of a silicon wafer, focused into a narrow beam, and scanned as a beam across an exposed surface of a polysilicon layer. Dopant ions impacting the surface enter the polysilicon layer and come to rest below the surface. A subsequent heating step is used to activate the dopant atoms within the polysilicon layer. Diffusion doping of a polysilicon layer is faster and cheaper than doping using ion implantation, and is therefore preferred. See, Wolf et al, *Silicon Processing for the VLSI Era*, Vol. 2, pp. 176–182 (incorporated herein by reference).

Phosphorus is a Group VA element and a common n-type dopant. A typical diffusion doping process used to introduce phosphorus atoms into a polysilicon layer is a batch process carried out in a diffusion furnace. Silicon wafers with polysilicon layers formed thereupon are placed on edge (i.e., vertically) in a wafer boat, and the wafer boat is placed within the diffusion furnace. A source of phosphorus atoms is introduced into the diffusion furnace and the temperature within the diffusion furnace is increased. Due to the closely-spaced arrangement of the silicon wafers in the wafer boat, all areas of the exposed surface are not equally accessible to phosphorus atoms. As a result, the uniformity of the doping of the polysilicon layer varies. It would thus be advantageous to have a polysilicon diffusion doping method which employs a highly uniform source of dopant atoms. Such a polysilicon diffusion doping method would result in highly uniform dopings of polysilicon layers.

SUMMARY OF THE INVENTION

The problems outlined above are in large part solved by a polysilicon diffusion doping method which employs a deposited dopant-rich oxide layer with a highly uniform distribution of dopant atoms and a highly uniform thickness. After a polysilicon layer has been formed upon a surface of a silicon wafer, a dopant-rich oxide layer is deposited upon the polysilicon layer at a pressure below atmospheric pressure. Deposition of the dopant-rich oxide layer at reduced pressure results in a dopant-rich oxide layer with a highly uniform distribution of dopant atoms and a highly uniform thickness. The dopant-rich oxide layer may be deposited using well known plasma-enhanced chemical vapor deposition (PECVD) or low-pressure chemical vapor deposition (LPCVD) techniques. The dopant-rich oxide layer serves as a source of dopant atoms during a subsequent heating step, resulting in a highly uniform doping of the underlying polysilicon layer. In a preferred embodiment, the dopant-rich oxide layer is a phosphosilicate glass (PSG) layer including phosphorus pentoxide ($P_2O_5$) and phosphorus trioxide ($P_2O_3$), and is deposited using a PECVD technique. Polysilicon layers 1,500 angstroms thick have been doped using the present method, achieving average resistance values of 60 ohms and non-uniformity values of 5 percent. Resistance values were measured using the four-point probe method with probe spacings of 0.10 cm.

Following deposition of the dopant-rich oxide layer, the silicon wafer is heated in order to drive dopant atoms from the dopant-rich oxide layer into the underlying polysilicon layer and to activate the dopant atoms within the polysilicon layer. A suitable heating step involves placing the silicon wafer into a diffusion furnace heated to about 875° C. for approximately 37 minutes. During the heating step, phosphorus atoms diffuse into the polysilicon layer and become electrically active within the polysilicon layer. The presence of electrically active dopant atoms within the polysilicon layer lowers the electrical resistivity of the polysilicon layer.

After the heating step, the dopant-rich oxide layer is removed. A preferred wet etch method involves dipping the silicon wafer in a solution containing 10 parts water to 1 part hydrofluoric acid (HF). The amount of time the silicon wafer must remain in the solution depends on the thickness of the dopant-rich oxide layer. A cleaning step may then be used to remove residual etch by-products from the wafer surface.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

It is well known that the rate at which a desired material is deposited upon an exposed surface at atmospheric pressure is limited by the rate at which reactant species can be supplied to, and by-products carried away from, the exposed surface. As a result, the uniformity of a resulting layer of the deposited material is reduced if all areas of the exposed surface are not equally accessible. If the deposition is carried out at a pressure below atmospheric pressure, however, the rate at which the desired material is deposited upon the exposed surface is limited by the rate at which chemical reactions occur at the exposed surface. A deposition carried out at a pressure below atmospheric pressure (i.e., a reduced pressure) thus allows a highly uniform layer of a desired material to be formed upon an exposed surface.

The present invention employs a dopant-rich oxide layer to dope an underlying polysilicon layer. The dopant-rich oxide layer is deposited upon the polysilicon layer at a pressure below atmospheric pressure, and serves as a source of dopant atoms during a subsequent heating step. As a direct result of being deposited at reduced pressure, the dopant-rich oxide layer has a highly uniform distribution of dopant atoms and a highly uniform thickness. The use of such a dopant-rich oxide layer as a source of dopant atoms results in a highly uniform doping of the underlying polysilicon layer.

Figure 1:
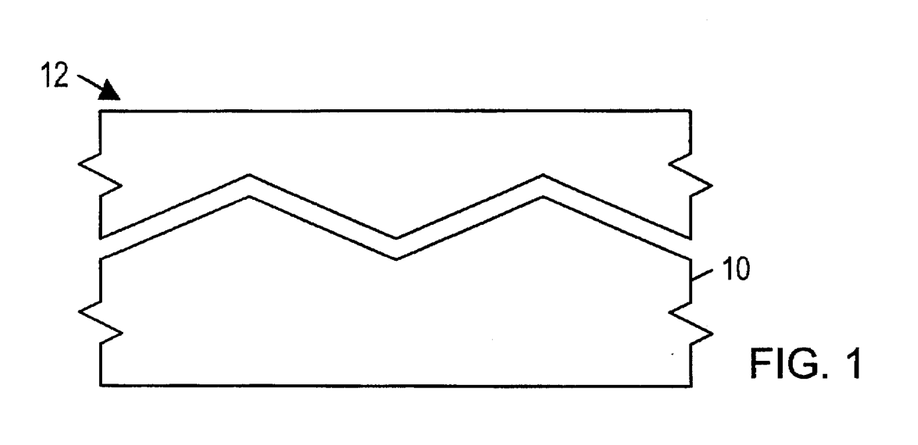
FIG. 1 is a partial cross-sectional view of a silicon wafer.
Figure 2:
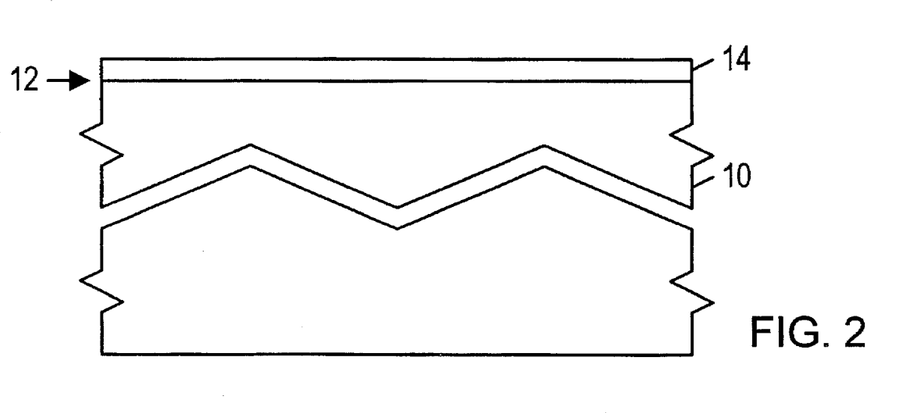
FIG. 2 is a partial cross-sectional view of the silicon wafer with an oxide layer formed over a frontside surface of the silicon wafer.

FIGS. 1–6 will be used to describe the polysilicon diffusion doping method by means of a typical application. FIG. 1 is a partial cross-sectional view of a silicon wafer 10 with a frontside surface 12 prepared for the fabrication of semiconductor devices. FIG. 2 is a partial cross-sectional view of silicon wafer 10 with an oxide layer 14 formed over frontside surface 12. Oxide layer 14 may be a gate oxide layer for MOS transistors or a tunneling oxide layer for electrically erasable programmable read only memory (EEPROM) cells. In either case, oxide layer 14 may be grown using well known oxidation techniques, and is formed to a thickness of between 60 angstroms and 200 angstroms.

Figure 3:
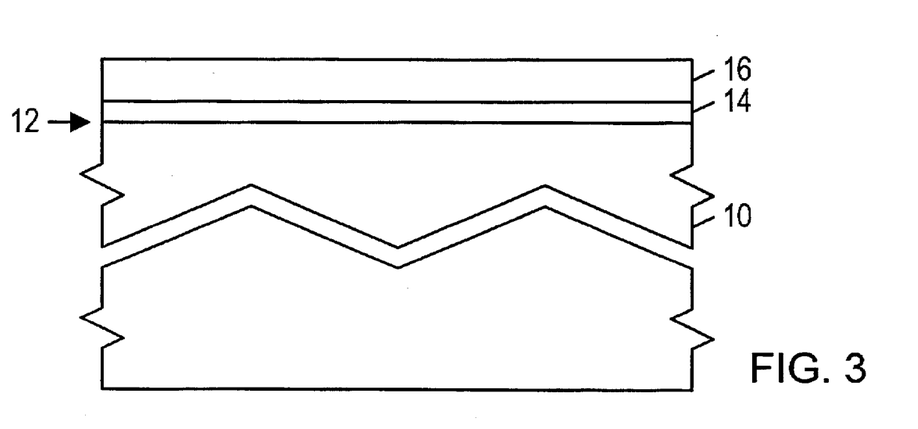
FIG. 3 is a partial cross-sectional view of the silicon wafer of FIG. 2 with a polysilicon layer formed over the oxide layer.

A layer of polysilicon (Si) is then deposited over oxide layer 14. FIG. 3 is a partial cross-sectional view of silicon wafer 10 with a polysilicon layer 16 formed over oxide layer 14 upon frontside surface 12. Polysilicon layer 16 may be formed according to common LPCVD techniques. In one such LPCVD technique, silicon wafer 10 is placed in a reaction chamber containing silane (SiH$_4$), the pressure within the reaction chamber is reduced, and the temperature within the reaction chamber is increased to between 540° C. and 650° C. Polysilicon layer 16 is thus formed over oxide layer 14 by the thermal decomposition of silane according to the following reaction:

SiH$_4$+(heat)→Si+2H$_2$

Polysilicon layer 16 is typically deposited to a thickness of between 1,500 angstroms and 5,000 angstroms.

Figure 4:
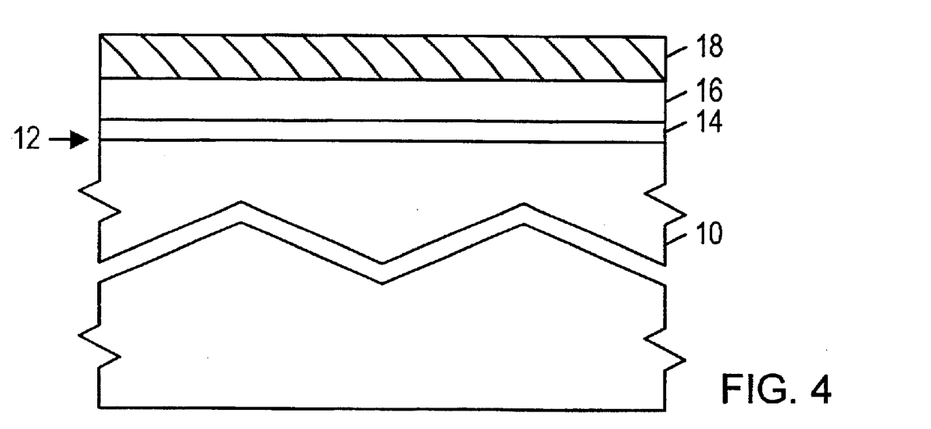
FIG. 4 is a partial cross-sectional view of the silicon wafer of FIG. 3 with a PSG layer formed over the polysilicon layer.

A layer of phosphosilicate glass (PSG) is then deposited over polysilicon layer 16. Although PECVD processes are described below, it is noted that the PSG layer may be deposited using well known LPCVD or PECVD techniques. FIG. 4 is a partial cross-sectional view of silicon wafer 10 with a PSG layer 18 formed over polysilicon layer 16 formed over oxide layer 14 upon frontside surface 12.

During a PECVD process, a silicon wafer is placed within a reaction chamber containing reactant gases. A glow discharge (i.e., a plasma) is formed within the reaction chamber when radio frequency (RF) energy is applied between a pair of electrodes within the reaction chamber (planar plasma etching) or to a coil surrounding the reaction chamber (inductively coupled plasma etching). The reactant gases produce chemically reactive species (atoms, ions, and radicals). These reactive species diffuse to an exposed surface of the silicon wafer, and are adsorbed on the surface. Chemical reactions occurring on the exposed surface result in the formation of a layer of a desired substance on the exposed surface. Volatile by-products are desorbed from the surface of the silicon wafer and diffuse into the ambient.

A preferred planar PECVD process is carried out using a model Concept 1 Dielectric planar PECVD apparatus manufactured by the Novellus Company (San Jose, Calif.). The PECVD apparatus will be described in more detail below. The preferred planar PECVD process includes many steps, some of which are as follows. First, silicon wafer 10 is placed between a pair of electrodes in a reaction chamber such that polysilicon layer 16 is exposed. Reactant gases silane (SiH$_4$), phosphine (PH$_3$), nitrous oxide (N$_2$O), and nitrogen (N$_2$) gases are introduced into the reaction chamber at flow rates of approximately 200 sccm, 1500 sccm, 10000 sccm, and 2420 sccm, respectively. The PH$_3$ source gas is 5 percent PH$_3$ balanced in nitrogen (i.e., 5 percent PH$_3$ and 95 percent N$_2$). The pressure within the reaction chamber is reduced to and maintained at 2.2 torr during the deposition process. RF power of 600 watts is preferably delivered at a frequency of 13.56 MHz between the two electrodes. The spacing between the pair of electrodes is generally maintained at about 1.4 cm during the etching process. The temperature of silicon wafer 10 is maintained at between 350° C. and 410° C. during the deposition process, with a preferred temperature of approximately 350° C. Silicon wafer 10 is subjected to the above process for a total of approximately 28 seconds.

The resulting PSG layer 18 contains oxide, phosphorus pentoxide (P$_2$O$_5$), and phosphorus trioxide (P$_2$O$_3$), formed according to the following chemical reactions:

SiH$_4$+4N$_2$O→SiO$_2$+4N$_2$+2H$_2$O  PH$_3$+N$_2$O→P$_2$O$_5$+P$_2$O$_3$+ . . .

The phosphorus content of PSG layer 18 formed as described above is typically between 4.0 and 6.0 percent by weight. PSG layer 18 is deposited to a thickness of between 1,250 angstroms and 3,000 angstroms, with a preferred thickness of about 1,750 angstroms.

An alternate PECVD process to form PSG layer 18 is also preferably carried out using the model Concept 1 Dielectric planar PECVD apparatus. The alternate planar PECVD process includes the following steps. First, silicon wafer 10 is placed between a pair of electrodes in a reaction chamber such that polysilicon layer 16 is exposed. Reactant gases tetraethyl orthosilicate (Si(OC$_2$H$_5$)$_4$ or TEOS), trimethylphosphite (P(OCH$_3$)$_3$ or TMP), and oxygen (O$_2$) gases are introduced into the reaction chamber at flow rates of approximately 0.42 sccm, 0.18 sccm, and 9000 sccm, respectively. The pressure within the reaction chamber is reduced to and maintained at 2.2 torr during the deposition process. A high frequency RF energy source preferably delivers about 450 watts of electrical power between the two electrodes at a frequency of approximately 13.56 MHz. In addition, a low frequency RF energy source preferably delivers about 550 watts of electrical power between the two electrodes at a frequency of approximately 275 kHz. The spacing between the pair of electrodes is generally maintained at about 1.4 cm during the etching process. The temperature of silicon wafer 10 is maintained at between 350° C. and 410° C. during the deposition process, with a preferred temperature of approximately 410° C. Silicon wafer 10 is subjected to the above process for a total of approximately 56 seconds. The resulting PSG layer 18 contains oxide, $P_2O_5$, and $P_2O_3$. The phosphorus content of PSG layer 18 thus formed is typically between 4.0 and 6.0 percent by weight. PSG layer 18 is deposited to a thickness of between 1,000 angstroms and 3,000 angstroms, with a preferred thickness of about 1,150 angstroms.

Figure 5:
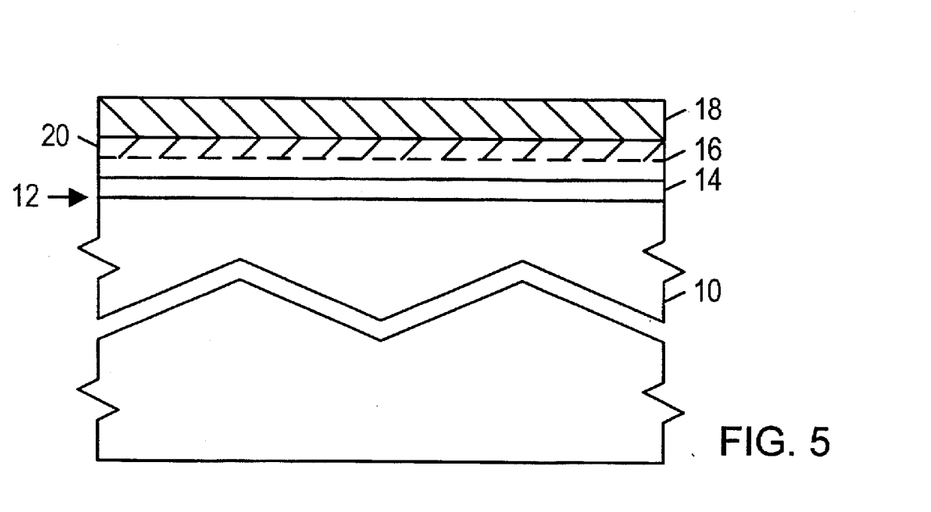
FIG. 5 is a partial cross-sectional view of the silicon wafer of FIG. 4 following a heating step during which phosphorus atoms diffuse from the PSG layer into the underlying polysilicon layer and form a phosphorus-rich region within the polysilicon layer.

Following deposition of PSG layer 18, silicon wafer 10 is heated in order to cause phosphorus atoms within PSG layer 18 to diffuse into underlying polysilicon layer 16. In a suitable heating step, silicon wafer 10 is placed within a diffusion furnace and heated to about 875° C. for approximately 37 minutes. As a result, phosphorus atoms diffuse into polysilicon layer 16 at the elevated temperature and form a phosphorus-rich region near an interface between PSG layer 18 and underlying polysilicon layer 16. FIG. 5 is a partial cross-sectional view of silicon wafer 10 following heating of silicon wafer 10 showing a phosphorus-rich region 20 formed by the diffusion of phosphorus atoms from PSG layer 18 into underlying polysilicon layer 16. The distribution of phosphorus atoms within phosphorus-rich region 20 is believed to be greatest at the interface between PSG layer 18 and polysilicon layer 16, and to decrease with increasing depth into polysilicon layer 16 from the interface. A significant number of the phosphorus atoms within phosphorus-rich region 20 become electrically active at the elevated temperature, resulting in a marked reduction in the electrical resistivity of polysilicon layer 16.

Figure 6:
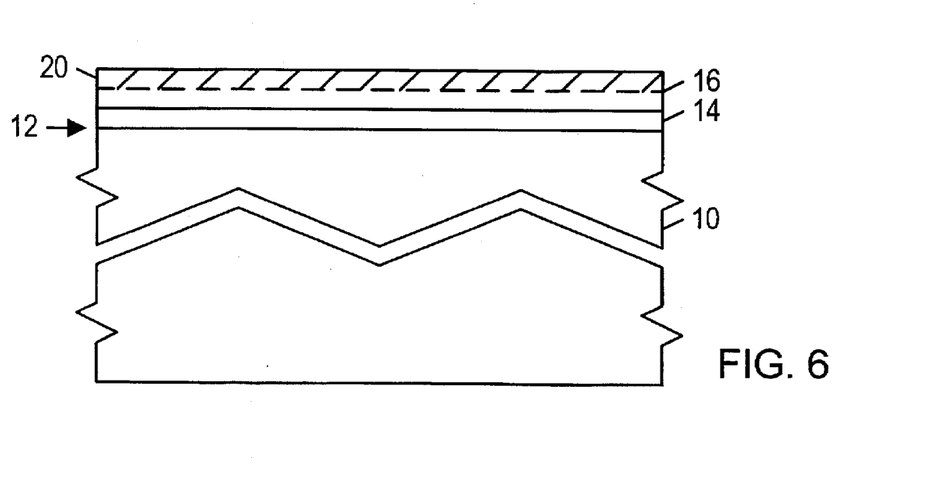
FIG. 6 is a partial cross-sectional view of the silicon wafer of FIG. 5 following removal of the PSG layer.

After silicon wafer 10 has been subjected to a heating step, PSG layer 18 is removed. PSG layer 18 is preferably removed using a wet etch process involving dipping silicon wafer 10 in a solution containing 10 parts water ($H_2O$) to 1 part hydrofluoric acid (HF) and maintained at 22° C. FIG. 6 is a partial cross-sectional view of silicon wafer 10 following removal of PSG layer 18. The amount of time silicon wafer 10 must remain in the solution depends on the thickness of PSG layer 18. A silicon wafer with a 1,750-angstrom-thick PSG layer must typically remain in the solution for 45 seconds to remove all of the PSG layer.

Silicon wafer 10 is then typically subjected to a cleaning procedure. The cleaning procedure preferably comprises a well known process called an RCA clean. An RCA clean involves first dipping silicon wafer 10 in a solution containing hydrogen peroxide and a base, then dipping silicon wafer 10 in a solution containing hydrogen peroxide and an acid. The RCA clean removes organic and inorganic residues.

The electrical resistivity of silicon depends upon the doping level, and polysilicon is one form of silicon. Resistance values and uniformities are thus proportional to doping levels and uniformities. One common method of measuring the resistance of a layer is known as the four-point probe method. A four-point probe consists of four thin metal probes arranged along a straight line. When used to measure the resistance of a doped polysilicon layer, the four probes are made to contact an upper surface of the doped polysilicon layer. A constant current is caused to flow between the two outer probes through the doped polysilicon layer, and a resultant voltage drop is measured between the two inner probes. The derived resistance of the doped polysilicon layer is directly proportional to the ratio of the measured voltage drop to the applied constant current and the distances between the probes.

Polysilicon layers 1,500 angstroms thick have been doped using the present method, achieving average resistance values of 60 ohms and non-uniformity values of 5 percent. Resistance values were measured using the four-point probe method with probe spacings of 0.10 cm. A total of 25 resistance measurements were made at various locations on each of several experimental wafers. The non-uniformity value, also called the coefficient of variation, is a relative measure of the variations between the resistance measurements made on a single wafer. Percent non-uniformity is calculated by dividing the sample standard deviation by the mean and multiplying the result by 100. As doping non-uniformity is directly proportional to resistance non-uniformity, and low non-uniformity values are representative of processes with high levels of uniformity, the present polysilicon doping method achieves a high level of doping uniformity.

Figure 7A:
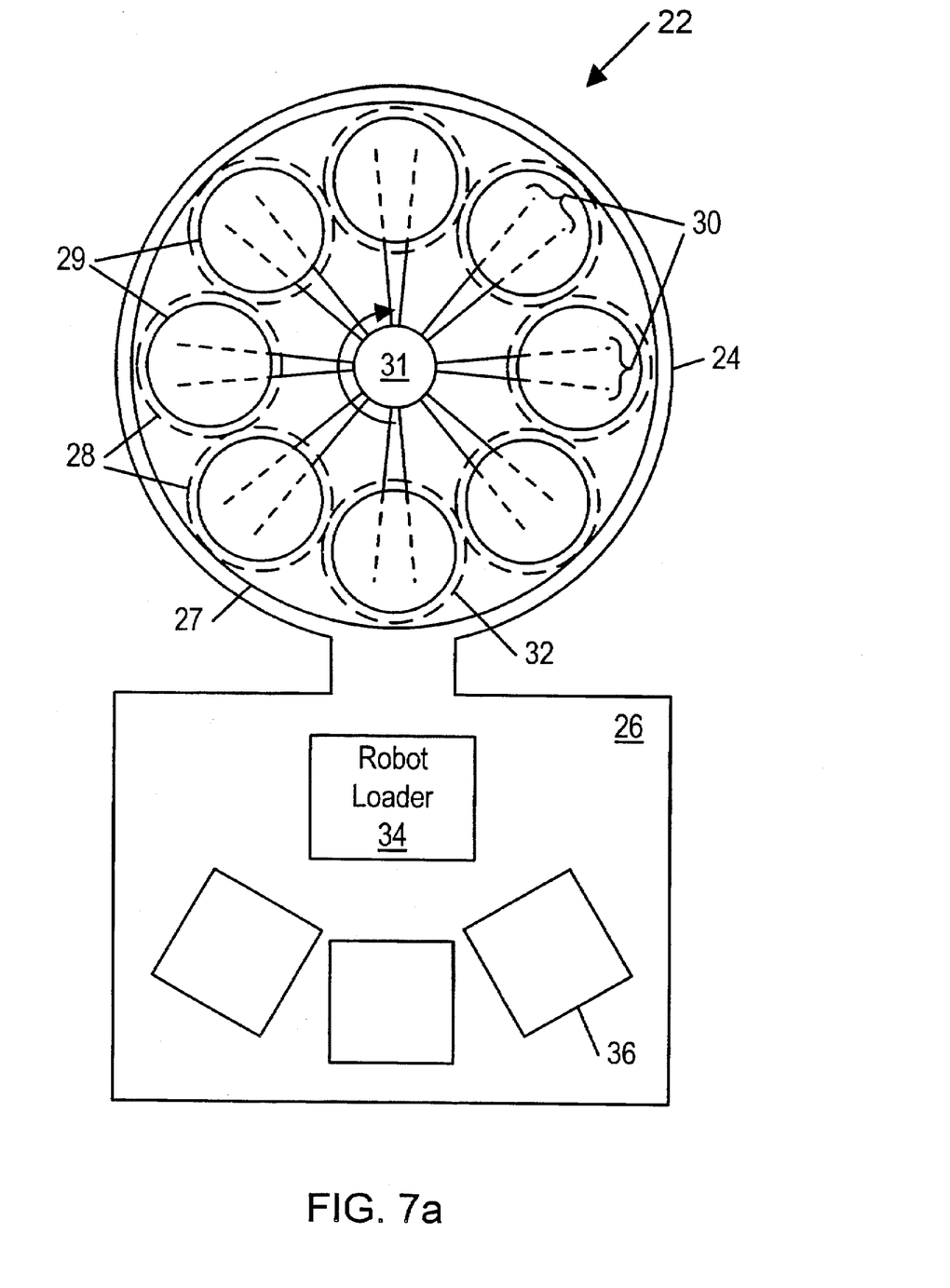
FIG. 7a is a top plan view of a preferred PECVD apparatus including a reaction chamber and a load lock chamber.
Figure 7B:
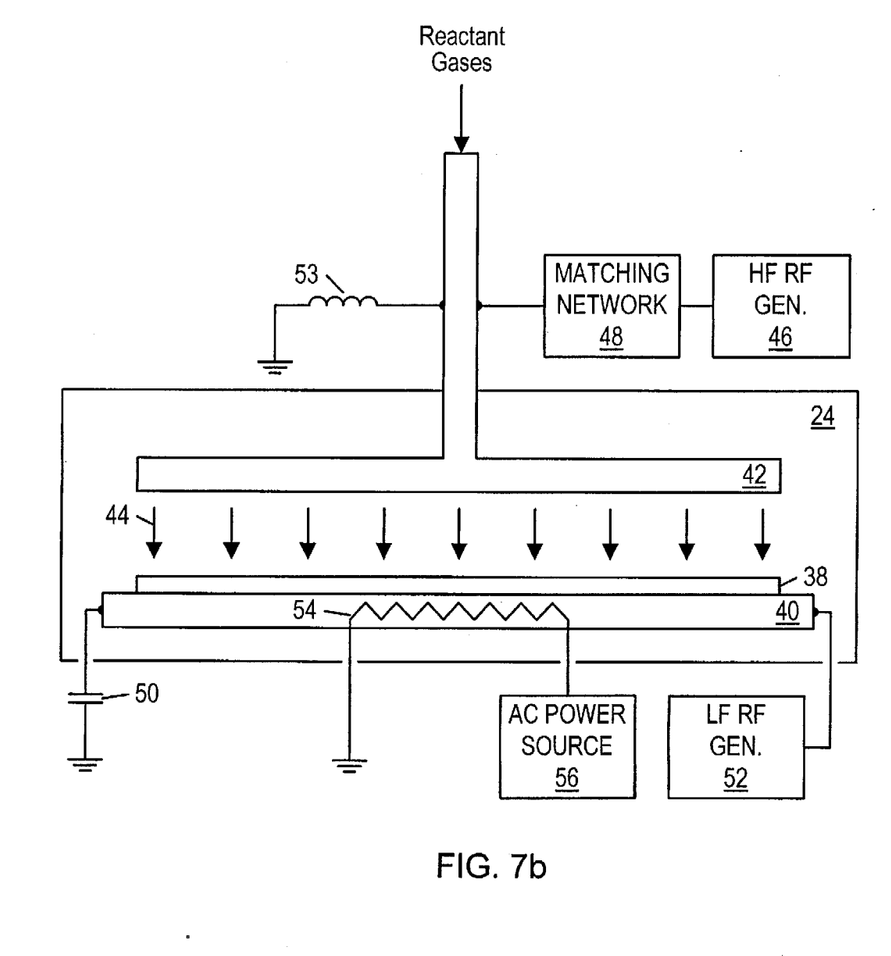
FIG. 7b is a operational representation of a silicon wafer undergoing a PECVD process within a processing station of the preferred PECVD apparatus.

FIGS. 7a and 7b will be used to describe the Novellus model Concept 1 Dielectric planar PECVD apparatus preferably used to deposit PSG layer 18 upon polysilicon layer 16. FIG. 7a is a top plan view of a Novellus Concept 1 Dielectric planar PECVD apparatus 22, which includes a reaction chamber 24 and a load lock chamber 26. Reaction chamber 24 includes a stationary heater block 27 with eight processing stations 28 evenly spaced about an outer edge. PECVD processing occurs when silicon wafers 29 are positioned within processing stations 28. A spindle assembly includes eight spindle forks 30 attached to a spindle hub 31. During processing, spindle forks 30 fit into recesses in heater block 27 below silicon wafers 29. Periods of processing are interrupted by transitional periods during which silicon wafers 29 are moved from one processing station to an adjacent processing station, creating a clockwise flow of silicon wafers 29 within reaction chamber 24. During the transitional periods, spindle hub 31 moves upward, lifting the eight spindle forks 30 along with supported silicon wafers 29. The spindle assembly then rotates 45 degrees in a clockwise direction, and the spindle assembly is lowered. As a result, silicon wafers 29 are moved from one processing station to the next in a clockwise fashion. A processing station 32 is reserved for wafer loading and unloading. Total processing time and applied RF power are equally divided among the remaining seven active processing stations A robot loader 34 removes a processed silicon wafer positioned within processing station 32 and places it in one of three wafer cassettes 36. Robot loader 34 then removes an unprocessed silicon wafer from one of the wafer cassettes 36 and places the wafer onto heater block 27 within empty processing station 32. PECVD apparatus 22 is thus fed in a continuous fashion until all silicon wafers have been processed.

FIG. 7b is a operational representation of a silicon wafer 38 undergoing a PECVD process in PECVD apparatus 22. Silicon wafer 38 is positioned within a processing station located upon an upper surface of a heater block 40. The processing station is located directly under a showerhead 42 which supplies an even flow of reactant gases 44 to all areas of an exposed upper surface of silicon wafer 38. A high frequency RF generator 46 is coupled through a matching network 48 to showerhead 42. High frequency RF generator 46 is configured to deliver RF energy at a frequency of about 13.56 MHz. Heater block 40 is electrically coupled to a ground potential at high frequencies by capacitor 50, thus high frequency RF generator 46 delivers high frequency RF energy between showerhead 42 and heater block 40 during operation. PECVD apparatus 22 also includes a low frequency RF generator 52 coupled to heater block 40. Low frequency RF generator 52 is configured to deliver RF energy at a frequency between 250 and 300 kHz. Showerhead 42 is electrically coupled to a ground potential at low frequencies by an inductor 53. When enabled, low frequency RF generator 52 delivers low frequency RF energy between heater block 40 and showerhead 42. A resistance heating coil 54 within heater block 40 is connected to an alternating current (AC) power source 56 and is used to heat silicon wafer 38 during processing.

As mentioned above, total processing time and applied RF power is equally divided among the active processing stations. Thus silicon wafer 38 undergoes processing for about one-seventh of the total processing time in each active processing station. The output of a single high frequency RF generator 46 is equally distributed among the seven active processing stations. Thus each active processing station receives one-seventh of the total high frequency RF power delivered during processing. Similarly, when enabled, the output of a single low frequency RF generator 52 is equally distributed among the seven active processing stations. Thus each active processing station receives one-seventh of the total low frequency RF power delivered during processing. It is noted that although processing station 32 is dedicated to wafer loading and unloading, processing station 32 is equipped with a showerhead 42 in order to achieve equivalent flow rates of reactant gases at all processing stations. Thus the flow rates of reactant gases are equally divided among all eight processing stations.

Figure 8:
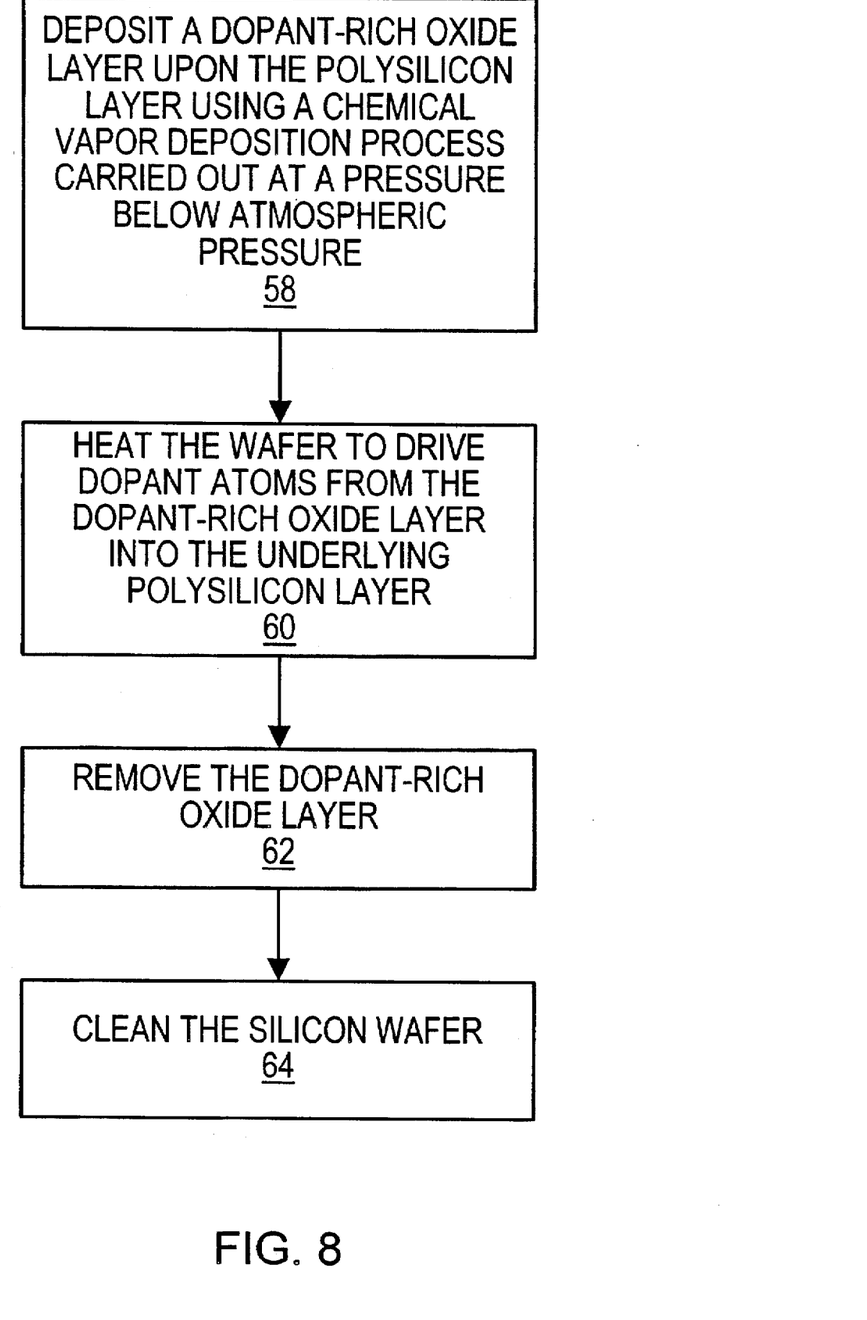
FIG. 8 is a flow chart of the present polysilicon diffusion doping method.

FIG. 8 is a flow chart of the present method of doping a polysilicon layer formed upon a surface of a silicon wafer, and will be used to summarize the method. During a first step 58, a dopant-rich oxide layer is deposited upon the polysilicon layer at a pressure below atmospheric pressure. The method takes advantage of the fact that a layer of a desired material with a highly uniform thickness may be formed at reduced pressure. Doping uniformity of the underlying polysilicon layer is dependent upon the uniformity of the thickness of the dopant-rich oxide layer. Although a preferred PECVD process is described above, other PECVD techniques may also be used. Well known LPCVD techniques may also be used to deposit the dopant-rich oxide layer.

During a step 60, the silicon wafer is heated in order to drive dopant atoms from the dopant-rich oxide layer into the underlying polysilicon layer. A suitable heating step involves placing the silicon wafer into a diffusion furnace heated to about 875° C. for approximately 37 minutes. During the heating step, phosphorus atoms diffuse into the polysilicon layer and become electrically active within the polysilicon layer. The presence of electrically active dopant atoms within the polysilicon layer lowers the electrical resistivity of the polysilicon layer.

The dopant-rich oxide layer is removed during a step 62. A preferred wet etch method described above includes dipping the silicon wafer 10 in a solution containing 10 parts water to 1 part hydrofluoric acid (HF). The amount of time the silicon wafer must remain in the solution depends on the thickness of the dopant-rich oxide layer. During an optional step 64, the silicon wafer is cleaned following removal of the dopant-rich oxide layer. The silicon wafer is preferably cleaned using an RCA clean procedure described above.

It will be appreciated to those skilled in the art having the benefit of this disclosure that this invention is believed to be capable of doping a polysilicon layer formed upon a surface of a silicon wafer. Furthermore, it is also to be understood that the form of the invention shown and described is to be taken as exemplary, presently preferred embodiments. Various modifications and changes may be made without departing from the spirit and scope of the invention as set forth in the claims. It is intended that the following claims be interpreted to embrace all such modifications and changes.

What is claimed is:

1. A method of doping a polysilicon layer formed upon a surface of a silicon wafer, comprising the steps of:

depositing a doped oxide layer upon said polysilicon layer at a pressure below atmospheric pressure;

heating the silicon wafer in order to drive dopant atoms from the doped oxide layer into the polysilicon layer; and removing the oxide layer.

2. The method as recited in claim 1, wherein the doped oxide layer comprises phosphorus.

3. The method as recited in claim 1, wherein the doped oxide layer comprises phosphosilicate glass (PSG).

4. The method as recited in claim 1, wherein the doped oxide layer is deposited by (i) inserting the silicon wafer into a reaction chamber containing a source of silicon, a source of oxygen, and a source of phosphorus, (ii) reducing the pressure within the reaction chamber, and (iii) increasing a temperature within the reaction chamber.

5. The method as recited in claim 4, wherein the silicon wafer is exposed to a plasma created within the reaction chamber.

6. The method as recited in claim 4, wherein the silicon wafer is positioned between a pair of electrodes within the reaction chamber, and a radio frequency energy is applied between the pair of electrodes.

7. The method as recited in claim 6, wherein the source of silicon comprises silane ($SiH_4$), the source of oxygen comprises nitrous oxide ($N_2O$), and the source of phosphorus comprises phosphine ($PH_3$).

8. The method as recited in claim 1, wherein the doped oxide is deposited to a thickness of between 1,000 angstroms and 3,000 angstroms.

9. The method as recited in claim 1, wherein the doped oxide is deposited to a thickness of about 1,150 angstroms.

10. The method as recited in claim 1, wherein the heating step is accomplished by placing the silicon wafer within a heated diffusion furnace for a period of time.

11. The method as recited in claim 8, wherein the diffusion furnace is heated to about 875° C.

12. The method as recited in claim 8, wherein the heating step is carried out for approximately 37 minutes.

13. The method as recited in claim 1, wherein the doped oxide layer is removed by etching.

14. The method as recited in claim 13, wherein the removing step is accomplished by dipping the silicon wafer in a solution comprising water ($H_2O$) and hydrofluoric acid (HF).

15. The method as recited in claim 1, further comprising a step of cleaning the silicon wafer, wherein the cleaning step follows the removing step, and the cleaning step involves first dipping the silicon wafer in a solution containing hydrogen peroxide and a base, then dipping the silicon wafer in a solution containing hydrogen peroxide and an acid.

16. A method of doping a polysilicon layer formed upon an exposed surface of a silicon wafer, comprising the steps of:

depositing a phosphosilicate glass (PSG) layer upon said polysilicon layer by placing the silicon wafer between a pair of electrodes in a reaction chamber containing reactant gases silane ($SiH_4$), phosphine ($PH_3$), nitrous oxide ($N_2O$), and nitrogen ($N_2$), reducing the pressure within the reaction chamber to below atmospheric pressure, increasing the temperature within the reaction chamber, and applying a radio frequency energy between the pair of electrodes;

heating the silicon wafer to about 875° C. for approximately 37 minutes in a diffusion furnace to drive dopant atoms from the PSG layer into the polysilicon layer; and removing the PSG layer by dipping the silicon substrate in a solution comprising water ($H_2O$) and hydrofluoric acid (HF).

17. The method as recited in claim 16, wherein the pressure within the reaction chamber is reduced to and maintained at about 2.2 torr during the deposition.

18. The method as recited in claim 16, wherein the temperature of the silicon wafer is maintained at between 350° C. and 410° C. during the deposition process.

19. The method as recited in claim 16, wherein the radio frequency energy comprises about 600 watts of electrical power delivered at a frequency of 13.56 MHz.

20. The method as recited in claim 16, wherein the PSG layer is deposited to a thickness of between 1,000 angstroms and 3,000 angstroms.

21. The method as recited in claim 16, wherein the PSG layer is deposited to a thickness of about 1,150 angstroms.

22. The method as recited in claim 16, further comprising a step of cleaning the silicon wafer by first dipping the silicon wafer in a solution containing hydrogen peroxide and a base, then dipping the silicon wafer in a solution containing hydrogen peroxide and an acid, wherein the cleaning step follows the removing step.

* * * * *